United States Patent
Tseng

(10) Patent No.: US 6,335,257 B1
(45) Date of Patent: Jan. 1, 2002

(54) METHOD OF MAKING PILLAR-TYPE STRUCTURE ON SEMICONDUCTOR SUBSTRATE

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/672,999

(22) Filed: Sep. 29, 2000

(51) Int. Cl.7 .................................. H01L 21/20
(52) U.S. Cl. .................. 438/397; 438/626; 438/631; 438/637; 438/669; 257/758; 257/760; 257/765
(58) Field of Search .................. 438/397, 626, 438/631, 637, 669; 257/758, 760, 765

(56) References Cited

U.S. PATENT DOCUMENTS

| | | | | |
|---|---|---|---|---|
| 5,861,673 A | * | 1/1999 | Yoo et al. | 257/758 |
| 5,895,975 A | * | 4/1999 | Lin | 257/758 |
| 6,000,280 A | * | 12/1999 | Miller et al. | 73/105 |

* cited by examiner

Primary Examiner—David Nelms
Assistant Examiner—Reneé R. Berry
(74) Attorney, Agent, or Firm—Bacon & Thomas

(57) ABSTRACT

The present invention provides a method in making a pillar-type structure (e.g. a storage node of stack capacitor) on a semiconductor substrate. By depositing a conductive polysilicon electrode layer, a nitride layer and a silicon layer on the substrate, and then required oxide pillars are formed in the silicon layer to act as a mask for etching the conductive polysilicon electrode layer.

10 Claims, 4 Drawing Sheets

METHOD OF MAKING PILLAR-TYPE STRUCTURE ON SEMICONDUCTOR SUBSTRATE

FIELD OF THE INVENTION

The present invention relates to a method in making a pillar-type structure on a semiconductor substrate, and more particularly to a method in making pillar-type capacitor node on a silicon substrate.

BACKGROUND OF THE INVENTION

In U.S. Pat. No. 5,482,885 Water Lur et al. had provided a method to form a capacitor in a DRAM cell by depositing a conductive polysilicon electrode layer on the substrate. Oxide lines are then formed on the polysilicon layer. Using the oxide lines as a mask to etch the polysilicon layer, pillar-type capacitor node is formed in the plolysilicon electrode layer.

The present application however provides a different way to form a pillar-type capacitor node on the silicon substrate.

OBJECT OF THE INVENTION

It is therefore an object of the present invention to provide a method in making a pillar-type structure on semiconductor substrate, by depositing sequentially a conductive polysilicon electrode layer, a nitride layer and a silicon layer on the substrate, and then forming required oxide pillars in the silicon layer to act as a mask for etching the conductive polysilicon electrode layer.

DETAILED DESCRIPTION OF THE INVENTION

Figure 1:
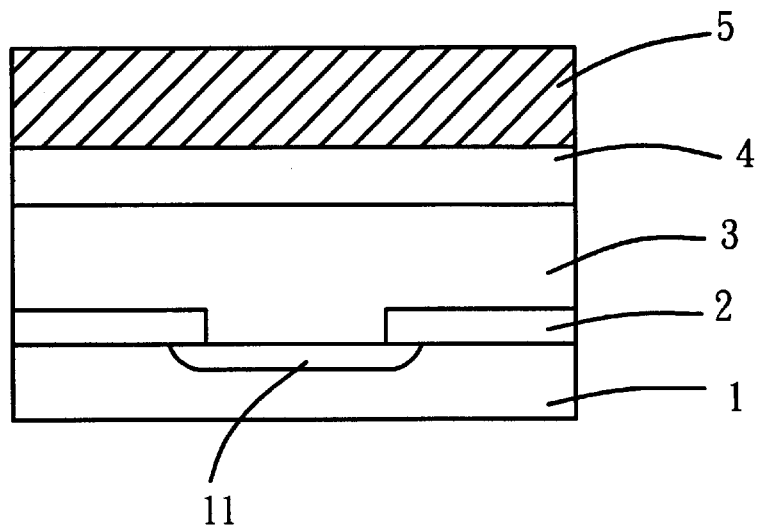
FIG. 1 shows that a conductive polysilicon electrode layer 3, a nitride layer 4 and a first silicon layer 5 are formed on the substrate 1.

Referring to FIG. 1, a semiconductor silicon substrate 1 is provided first to form a diffusion region 11 (e.g. a source region) therein, then a CVD process is conducted to form a dielectric layer 2 on the semiconductor silicon substrate 1, followed by a photolithography process and an anisotropic plasma etching process to remove part of the dielectric layer 2, so as to form a recess to expose the diffusion region 11 of the silicon substrate 1.

Next, a CVD process is conducted again to deposit a polysilicon layer 3 of thickness 3000~8000 Å to cover the dielectric layer 2 and fill up the recess, then a CVD process is conducted for form a $Si_3N_4$ layer 4 of thickness 300~800 Å on the polysilicon layer 3.

A first silicon layer 5 of thickness 2500~5000 Å is then deposited on the $Si_3N_4$ layer 4. The first silicon layer 5 can be a doped polysilicon layer, an undoped polysilicon layer or an amorphous silicon layer, but preferably using doped polysilicon.

Figure 2:
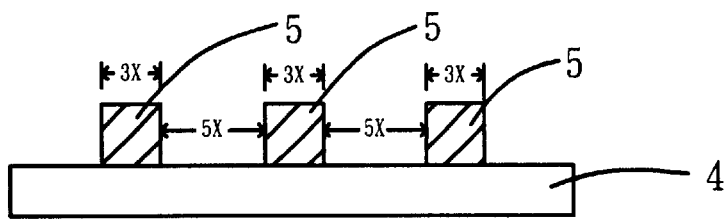
FIG. 2 shows that the first silicon layer 5 is etched being divided into a plurality of regions to be spaced apart by a distance of 5X, and each region has a width of 3X.

Referring to FIG. 2, which just shows the $Si_3N_4$ layer 4 and the first silicon layer 5 to simplify the drawing, but the silicon substrate 1, the dielectric layer 2 and the polysilicon layer 3 are still exist below the $Si_3N_4$ layer 4. As shown in FIG. 2, a photolithography process and an etching process are employed to etch the first silicon layer 5 to expose the $Si_3N_4$ layer 4 intermittently such that the first silicon layer 5 is divided into a plurality of regions to be spaced apart by a distance of 5X, and each region has a width of 3X (X for example is between 100~500 Å).

Figure 3:
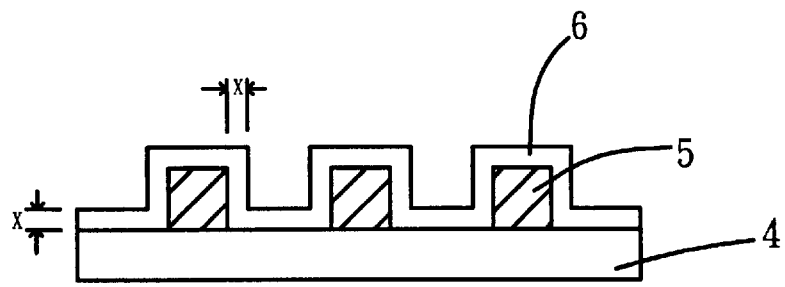
FIG. 3 shows that a doped $SiO_2$ layer 6 of thickness X is deposited.
Figure 4:
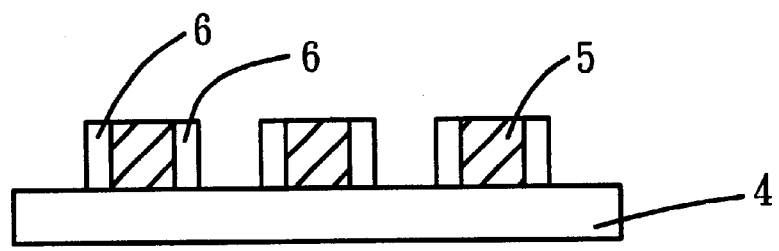
FIG. 4 shows that etchingback process is conducted to form spacers 6 abutting the first silicon layer 5.

Referring to FIG. 3, a doped $SiO_2$ layer 6 of thickness X (100~500 Å) is deposited as shown, and then etched back by fluorine plasma to form spacers 6 abutting the first silicon layer 5, as shown in FIG. 4.

Figure 5:
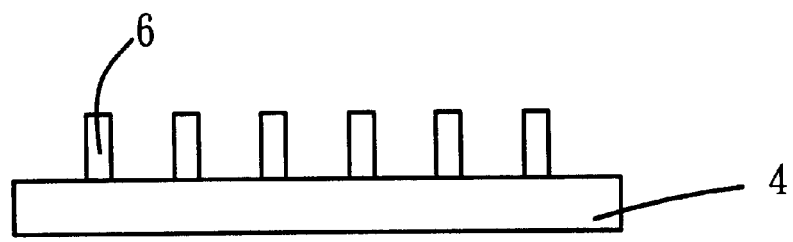
FIG. 5 shows that the remained first silicon layer 5 is removed.

Referring to FIG. 5, the remained first silicon layer 5 is removed by isotropic etching in $SF_6$ gas plasma, so that the distance between the spacers 6 is 3X.

Figure 6:
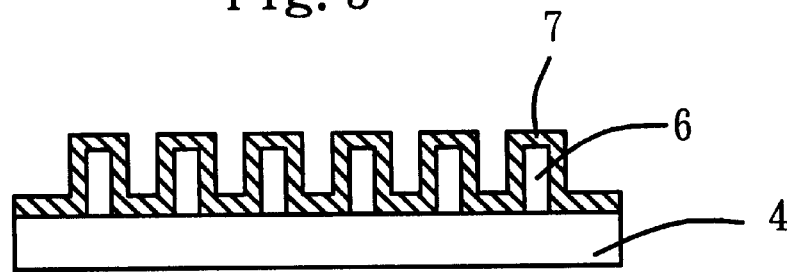
FIG. 6 shows that a second silicon layer 7 of thickness X is deposited.
Figure 7:
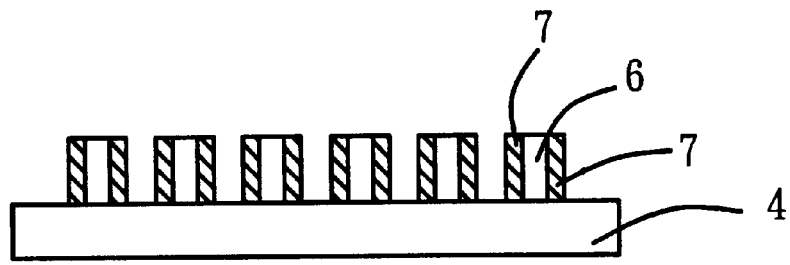
FIG. 7 shows that etchingback process is conducted to form spacers 7 abutting the spacers 6.

Referring to FIG. 6, a second silicon layer 7 of thickness X (100~500 Å) is deposited and then etched back to form spacers 7 abutting the spacers 6, as shown in FIG. 7. The distance between the spacers 7 is also X. The second silicon layer 5 can be a doped polysilicon layer, an undoped polysilicon layer or an amorphous silicon layer, but preferably using doped polysilicon.

Figure 8:
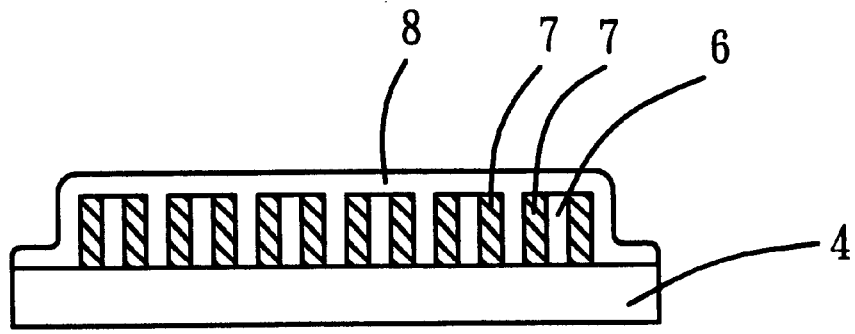
FIG. 8 shows that a doped $SiO_2$ layer 8 is deposited.

Referring to FIG. 8, a doped $SiO_2$ layer 8 is deposited to cover everything above the $Si_3N_4$ layer 4 and fill up the spaces between spacer 7.

Figure 9:
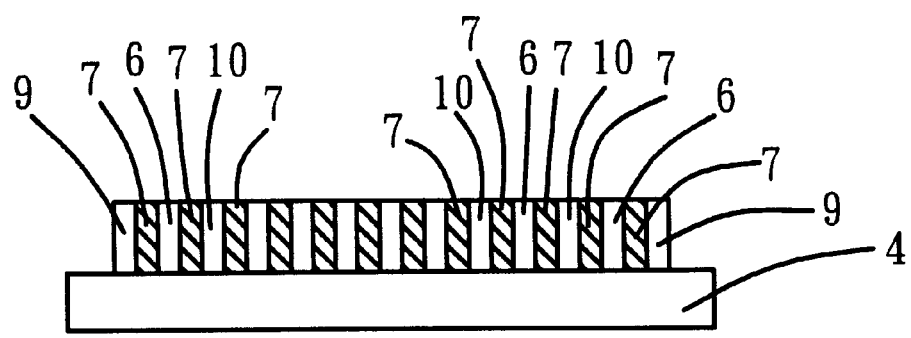
FIG. 9 shows that etchingback process is conducted on the $SiO_2$ layer 8 to form spacer 9 and stud 10.

Referring to FIG. 9, by etchingback the doped $SiO_2$ layer 8 to form spacers 9 of thickness X (100~500 Å) abutting the the spacers 7 and form studs 10 between the the spacers 7, as shown in the figure.

Figure 10:
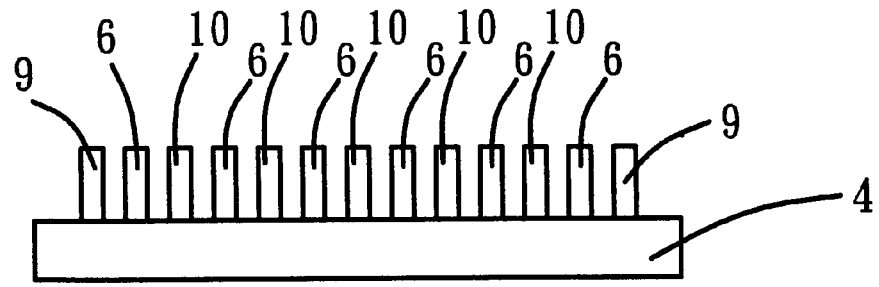
FIG. 10 shows than the spacer 7 is removed so that the distance between the remained oxide pillars is X.

Referring to FIG. 10, the spacers 7 are removed by isotropic etching in $SF_6$ gas plasma so that the distance between the remained oxide pillars is X (100~500 Å).

Figure 11:
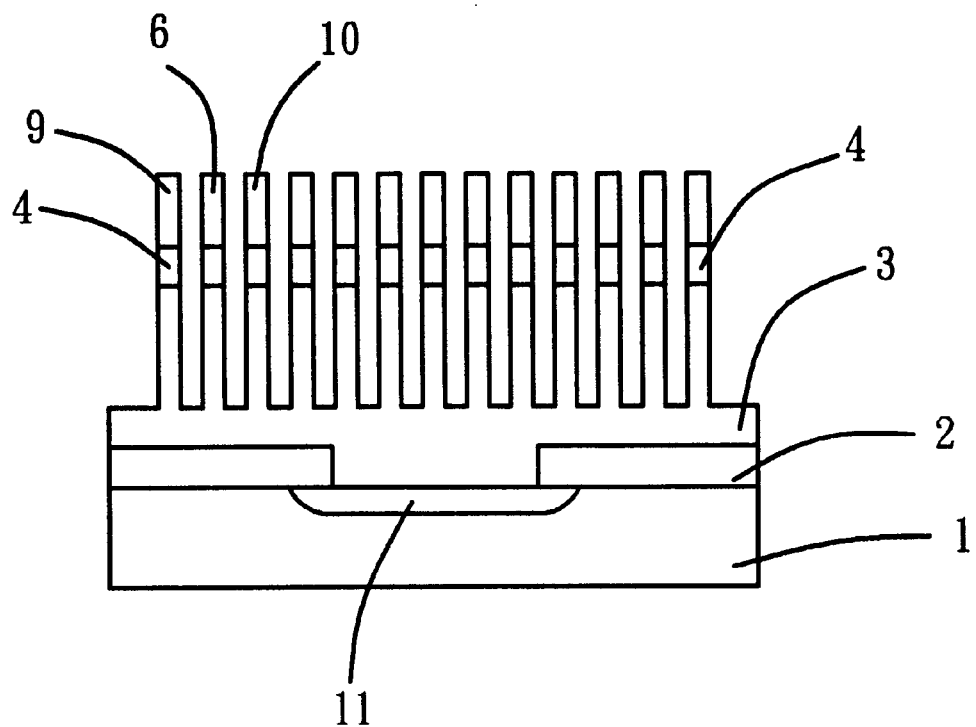
FIG. 11 shows that an etching process is conducted on the $Si_3N_4$ layer 4 and the polysilicon layer 3 below the spacer 7.

Referring to FIG. 11, anisotropic etching the $Si_3N_4$ layer 4 and the polysilicon layer 3 below the spacers 7 to a depth without exposing the oxide layer 2 on said semiconductor silicon substrate 1.

Figure 12:
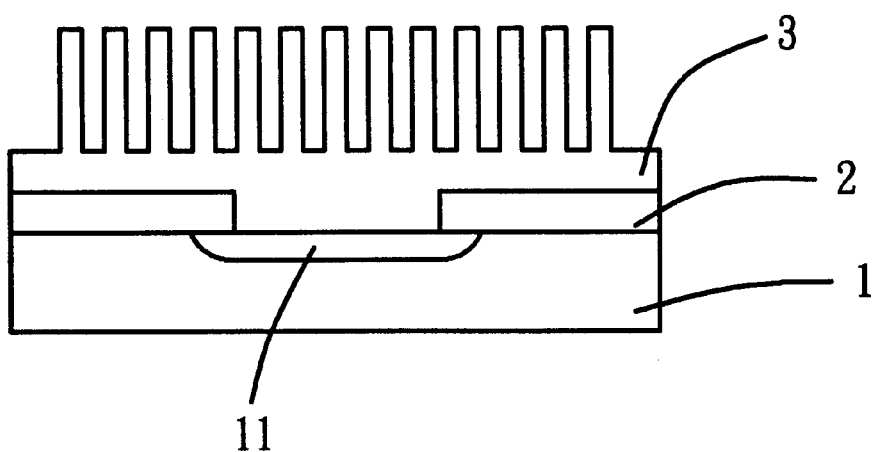
FIG. 12 shows that the remained spacer 6, spacer 9, stud 10 and the $Si_3N_4$ layer 4 are removed.

Referring to FIG. 12, removing the spacers 6, the spacers 9, the studs 10 and the $Si_3N_4$ layer 4 that remained to expose the polysilicon layer 3, a pillar-type capacitor node is formed on the silicon substrate 1.

The scope of the present invention depends only upon the following Claims, and is not limited by the above embodiment.

What is claimed is:

1. A method of making a pillar-type structure on a semiconductor substrate, comprising the steps of:

a. providing a semiconductor substrate to form a conductive region therein, b. forming a dielectric layer on said semiconductor substrate;

c. a photolithography process and an etching process are conducted to remove part of the dielectric layer, so as to expose the conductive region;

d. depositing a first conductor layer to cover the dielectric layer and have an electrical contacting with the conductive region;

e. forming a first insulator layer on the first conductor layer;

f. depositing a first silicon layer on the first insulator layer;

g. employing photolithography process and etching process to etch the first silicon layer to expose the first insulator layer intermittently such that the first silicon layer is divided into a plurality of regions to be spaced apart by a predetermined distance, and each of said regions has a width of about 3/5 of said predetermined distance;

h. depositing a second insulator layer with a thickness of about 1/5 of said predetermined distance and etching-back to form second insulator spacers abutting the first silicon layer;

i. removing the remained first silicon layer;

j. depositing a second silicon layer with a thickness of about 1/5 of said predetermined distance and etching-back to form second silicon spacers abutting the second insulator spacers;

k. depositing a third insulator layer to cover everything above the first insulator layer and fill up the spacers between second silicon spacers abutting the second insulator spacers;

l. etchingback the third insulator layer to form third insulator spacers with a thickness of about 1/5 of said predetermined distance abutting the second silicon spacers and form third insulator studs between the second silicon spacers;

m. removing the second silicon spacers;

n. etching the first insulator layer and the first conductor layer below the second silicon spacers to a depth without exposing the dielectric layer on said semiconductor substrate;

o. removing the remained first insulator layer, the second insulator spacers, the third insulator spacers and the third insulator studs.

2. The method according to claim 1, wherein the first conductor layer is a doped polysilicon layer.

3. The method according to claim 1, wherein the first insulator layer is a material selected from a group consisting of silicon nitride, oxynitride, and silicon oxide.

4. The method according to claim 1, wherein the first silicon layer is a material selected from a group consisting of doped polysilicon, undoped polysilicon, and amorphous silicon.

5. The method according to claim 1, wherein the second insulator layer is a doped silicon oxide layer or an undoped silicon oxide layer.

6. The method according to claim 1, wherein the second silicon layer is a material selected from a group consisting of doped polysilicon, undoped polysilicon, and amorphous silicon.

7. The method according to claim 1, wherein the third insulator layer is a doped silicon oxide layer or an undoped silicon oxide layer.

8. The method according to claim 1, wherein the conductive region is a source region or a drain region of MOSFET.

9. The method according to claim 1, wherein the semiconductor substrate is a single crystalline silicon.

10. The method according to claim 1, wherein the predetermined distance is between 100 Å~500 Å.

* * * * *